United States Patent

Yoshida et al.

[19]

[11] 4,242,714
[45] Dec. 30, 1980

[54] CURRENT CONTROL CIRCUIT

[75] Inventors: Susumu Yoshida; Yoshio Ishigaki, both of Tokyo; Tamiji Nagai, Kawasaki, all of Japan

[73] Assignee: Sony Corporation, Tokyo, Japan

[21] Appl. No.: 22,868

[22] Filed: Mar. 21, 1979

[30] Foreign Application Priority Data

Mar. 27, 1978 [JP] Japan .................................. 53-35001

[51] Int. Cl.³ ............................................. H01J 29/70
[52] U.S. Cl. .................................... 361/152; 361/153;
315/371; 315/395; 315/408
[58] Field of Search ................... 315/408, 371, 395;
361/160, 152, 156, 159, 153

[56] References Cited

U.S. PATENT DOCUMENTS

| 3,999,102 | 12/1976 | Gent et al. ..................... 315/408 X |
| 4,024,434 | 5/1977 | Joosten et al. ................. 315/408 X |
| 4,115,725 | 9/1978 | Hashimoto ..................... 315/408 X |

FOREIGN PATENT DOCUMENTS

2815028 10/1978 Fed. Rep. of Germany ........... 315/371

*Primary Examiner*—J. D. Miller
*Assistant Examiner*—L. C. Schroeder
*Attorney, Agent, or Firm*—Lewis H. Eslinger; Alvin Sinderbrand

[57] ABSTRACT

In a circuit for controlling the current flow through a coil, such as the horizontal deflection coil of a television receiver, a first switching device including, for example, a first switching transistor and a first damper diode is connected in parallel with a first resonant circuit including a first capacitor and a first coil, which is the coil through which the current flow is to be controlled. A second switching device including for example, a second switching transistor and a second damper diode is connected in parallel with a second resonant circuit including a second capacitor and a second coil. First and second charging capacitors are connected in series with the first and second coils, respectively, and the power is supplied to the first and second resonant circuits for example through a third coil. Switching signals of the same frequency, for example, the horizontal frequency of a video signal, are applied to the first and second switching transistors with the phase difference between such signals being controlled to vary the relative voltages across the first and second charging capacitors and hence "to control" the current flowing through the first coil. The phase difference between the switching signals can be varied by a parabolic correcting signal having the vertical frequency of a video signal to cause the current flow through the horizontal deflection coil to correct for the side pin-cushion distortion of the raster of a cathode ray tube. In another embodiment of the invention, the phase difference between the switching signals can be modulated by a sawtooth wave signal having the vertical frequency so that the voltage across the first or second charging capacitor varies in a sawtooth manner at the vertical frequency and so that if a vertical deflection coil is connected across the first or second charging capacitor a sawtooth shaped current flow will take place through it, causing proper vertical deflection.

9 Claims, 25 Drawing Figures

CURRENT CONTROL CIRCUIT

BACKGROUND OF THE INVENTION

1. Field of the Invention

This invention relates generally to a circuit for controlling the current flow through a coil, such as the horizontal deflection coil of a television receiver.

2. Description of the Prior Art

In a television receiver, the electron beam in a cathode ray tube is electromagnetically deflected by means of a deflection yoke positioned about the neck of the cathode ray tube. Deflection circuits are provided to cyclically vary currents flowing in windings of the deflection yoke so that the resulting electromagnetic fields deflect the electron beam or beams to form a raster on the face of the cathode ray tube. In most instances, it is desirable that such raster be of rectangular shape. However, various distortions occur in the scanning of the face of the cathode ray tube by the electron beam and cause deviation of the configuration of the raster from the desired rectangular shape. One form of raster distortion is the so-called side pin-cushion distortion which results primarily from the physical geometry of the deflection system. Such pin-cushion distortion is well-recognized to be undersirable, and many arrangements have been proposed to correct or compensate therefor.

An arrangement proposed to correct or compensate for such side pin-cushion distortion involves modulation of the power voltage supplied to the horizontal deflection circuit of the television receiver by means of a parabolic signal having a repetition rate equal to the vertical or field frequency of a video signal so that the horizontal deflection current is modulated by such parabolic signal. Usually, a variable impedance element in the form of a transistor is connected in series with the power supply path for effecting the desired modulation of the power voltage supplied to the horizontal deflection circuit and, in such case, a relatively large power consumption or loss is experienced in the transistor. Further, if the high voltage that has to be supplied to the anode of the cathode ray tube is obtained from the secondary winding of a fly-back transformer and the power voltage is supplied to the horizontal deflection circuit through a primary winding of such fly-back transformer, the modulation of the power supply voltage by the parabolic signal varying at the vertical rate results in the high or anode voltage obtained from the secondary winding also varying parabolically at the vertical rate so that a constant anode voltage cannot be obtained. The resulting variation in the anode voltage causes a corresponding change or variation in the brightness of the picture displayed on the cathode ray tube screen. Therefore, in order to obtain a constant high or anode voltage, it has been necessary to provide a high voltage generating circuit independent of the horizontal deflection circuit where the above described arrangement is employed to correct for side pin-cushion distortion.

In another arrangement provided for dynamically correcting for side pin-cushion distortion, a saturable reactor is connected in series with the horizontal deflection coil or winding, and the reactance or inductance of the saturable reactor is modulated by the parabolic signal at the vertical rate so that the horizontal deflection current is modulated by such parabolic signal. However, due mostly to the characteristic of the saturable reactor, the linearity of the horizontal deflection current flowing through the horizontal deflection coil is deteriorated. Further, if the high or anode voltage is obtained from the secondary winding of the fly-back transformer which has its primary winding connected in series with the power supply path to the horizontal deflection circuit, variation of the inductance determining the retrace resonant frequency and, therefore, variation of the pulse width of the fly-back pulse, causes the high voltage obtained from the secondary winding of the fly-back transformer to vary parabolically at the vertical rate, as in the first described arrangement according to the prior art.

OBJECTS AND SUMMARY OF THE INVENTION

Accordingly, it is an object of this invention to provide an improved circuit for controlling the current flow through a coil which avoids the above described disadvantages of the prior art.

More particularly, it is an object of this invention to provide an improved circuit for controlling the current flow through the horizontal deflection coil of a television receiver.

Another object is to provide an improved circuit for controlling the current flow through the horizontal deflection coil of a television receiver so as to correct or compensate for the so-called side pin-cushion distortion of the raster.

Still another object is to provide an improved current control circuit for the horizontal deflection coil, as aforesaid, in which the linearity of the horizontal deflection current is not deteriorated.

Yet another object is to provide an improved side pin-cushion distortion correcting circuit which entails only a relatively small power loss.

A further object of the invention is to provide an improved side pin-cushion distortion correcting circuit which permits a high voltage, such as is required for application to the anode of a cathode ray tube, to be obtained from the horizontal deflection circuit without being affected by the parabolic signal employed for correcting the pin-cushion distortion.

A still further object of the invention is to provide an improved current control circuit by which the size of the raster, in the vertical direction, is stabilized or made constant notwithstanding the fact that variations occur in the electron beam current or in the anode voltage of the cathode ray tube.

A yet further object of the invention is to provide an improved current control circuit by which an improved vertical deflection circuit having improved linearity in its vertical deflection current can be realized.

In accordance with an aspect of this invention, a current control circuit is provided which has first and second switching means, a first resonant circuit connected in parallel with said first switching means and including a first coil and a first capacitor, a second resonant circuit connected in parallel with said second switching means and including a second coil and a second capacitor, a first charging capacitor connected in series with the first coil and a second charging capacitor connected in series with the second coil, means for connecting the first and second resonant circuits in series with each other with respect to a power supply, means for applying first and second switching signals of the same frequency to the first and second switching means, respectively, and means for varying the phase relation of the first and second switching signals, so as to control the voltages across the first and second charging capacitors and, accordingly, to control the current flowing through the first and second coils.

In a preferred embodiment of the invention a coil is connected in series between the first and second resonant circuits and the power supply, and the first and second switching means each include a switching transistor and a damper diode.

In an embodiment of the invention used to provide horizontal deflection in a television receiver and to correct for side pin-cushion distortion, the above mentioned first coil of the current control circuit is the horizontal deflection coil, the first and second switching signals have a horizontal deflection frequency, and the phase relation between the first and second switching signals is varied parabolically at a vertical deflection frequency.

In another embodiment of the invention, the phase difference between the first and second switching signals is modulated or varied by a sawtooth wave signal with the vertical frequency and a vertical deflection coil is connected across the first or second charging capacitor to produce a vertical deflection circuit.

The above and other objects, features and advantages of the invention will be apparent in the following detailed description of illustrative embodiments of the invention which are to be read in connection with the accompanying drawings in which like reference numerals designate like elements.

DESCRIPTION OF THE PREFERRED EMBODIMENTS

With reference to the attached drawings, the present invention will be hereinafter described.

Figure 1:
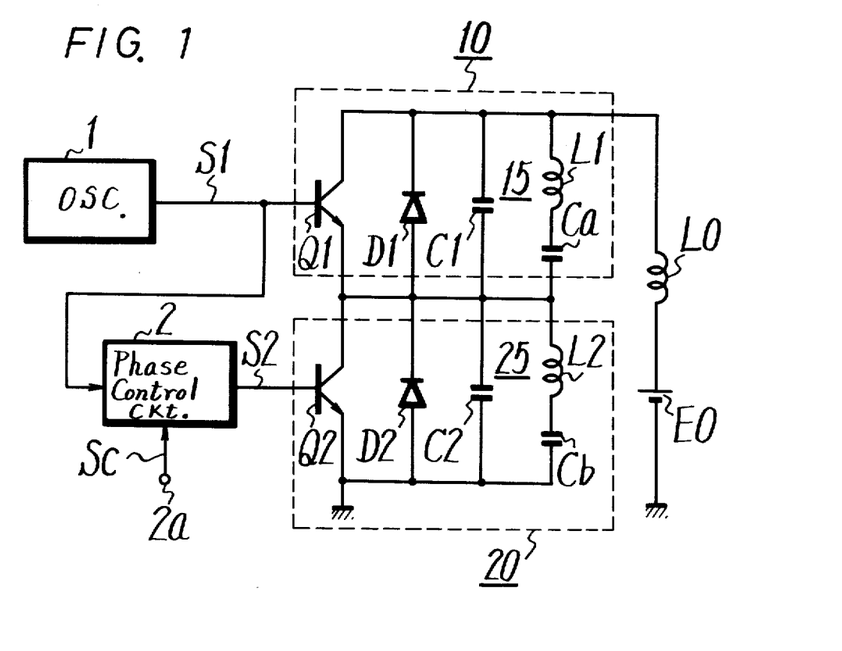
FIG. 1 is a circuit diagram showing a fundamental embodiment of the present invention.

FIG. 1 shows the fundamental embodiments of a current control circuit according to the present invention. The current control circuit includes first and second converters 10 and 20 connected in series, which are formed of transistors Q1 and Q2, respectively, which serve as switching elements. The first and second converters 10 and 20 further include parallel resonant circuits 15 and 25, including a coil L1 and a capacitor C1 and a coil L2 and a capacitor C2, respectively. The resonant circuits 15 and 25 have connected thereto charging capacitors Ca and Cb, respectively, whose maximum charging voltage can be controlled. D1 and D2 designate damper diodes in the resonant circuits 15 and 25, respectively.

The first and second converters 10 and 20 are connected with a power supply source E0 through a coil L0. The switching transistors Q1 and Q2 are controlled by rectangular waveform switching signals S1 and S2, respectively, which will be described later, and the charging voltages of the capacitors Ca and Cb are controlled by controlling the relative phase of the switching signals S1 and S2. The currents flowing through the coils L1 and L2 are varied in accordance with charging voltages Ea and Eb across the capacitors Ca and Cb, respectively.

Accordingly, if the coil L1 or L2 is used as a load, for example, as the horizontal deflection coil of a television receiver, and the relative phase of the switching signals S1 and S2 is controlled suitably, that load can be driven by the circuit of FIG. 1. Similarly, if a load, for example, a vertical deflection coil, speaker or the like, is connected to the connection point between the coil L1 and the capacitor Ca or that between the coil L2 and the capacitor Cb and the relative phase of the switching signals S1 and S2 is controlled suitably as in the above case, such a load can also be driven.

In the example of FIG. 1, the switching signal S1 is provided as a reference signal for the other switching signal S2, which can be phase-shifted relative to signal S1. To this end, the switching signal S1 with a predetermined frequency is generated from an oscillator 1, which is a horizontal oscillator when the current control circuit of FIG. 1 is employed in the horizontal deflection circuit of a television receiver, and the switching signal S1 is then fed to a phase control circuit 2 which is supplied with a phase control signal Sc through a terminal 2a. The phase-shifts circuit 2 phase-controls the switching signal S1 by an amount determined by the control signal Sc to produce the switching signal S2.

Now, the variation of the charging voltages Ea and Eb of the capacitors Ca and Cb caused by changing the relative phase of the switching signals S1 and S2 will be described. In this case, for convenience of explanation, a horizontal oscillator is used as the oscillator 1 and the values of the coils L0, L1, and L2 and the capacitors Ca, Cb, C1, and C2 are assumed to satisfy the following expressions (1) and (2).

$$\left. \begin{array}{l} L1 = L2 \\ Ca = Cb \\ C1 = C2 \end{array} \right\} \quad (1)$$

$$\left. \begin{array}{l} L1 < L0 \\ Ca >> C1 \end{array} \right\} \quad (2)$$

Figure 2A:
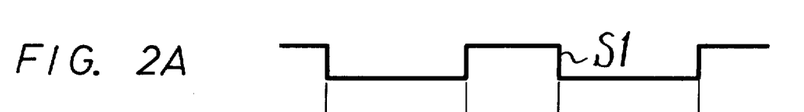
FIGS. 2A-2D, 3A-3H and 5A-5C are waveform diagrams used for explaining the operation of the example shown in FIG. 1.
Figure 2B:
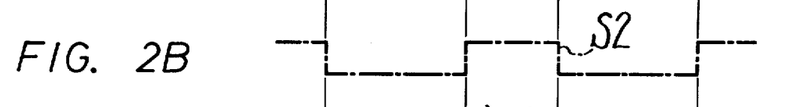
Figure 2C:
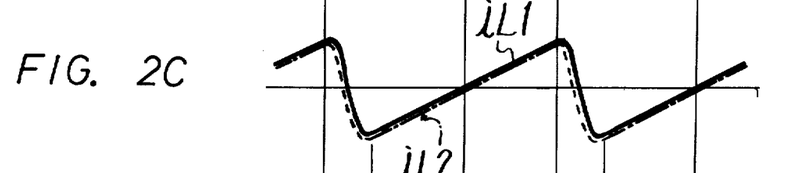
Figure 2D:
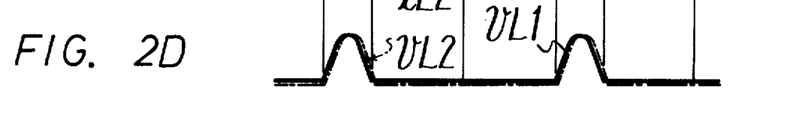

When the switching signals S1 and S2 have the same phase as shown in FIGS. 2A and 2B, both the converters 10 and 20 operate virtually independently of each other, except that as circuit elements placed in series they divide the voltage E0 placed across them. In this case, due to the expression (1), the charging voltages Ea and Eb across the capacitors Ca and Cb are both equal to ½ E0, where E0 is the voltage of the power source E0. Therefore, currents iL1 and iL2 flowing through the coils L1 and L2 are equal as shown in FIG. 2C, and pulse voltages vL1 and vL2 appearing across the coils L1 and L2 are also equal as shown in FIG. 2D.

Figure 3A:
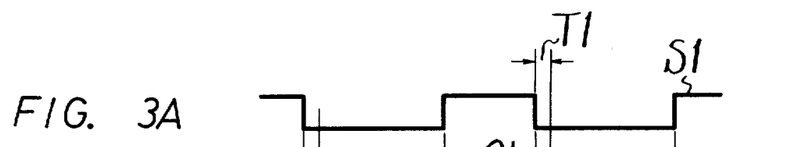
Figure 3B:
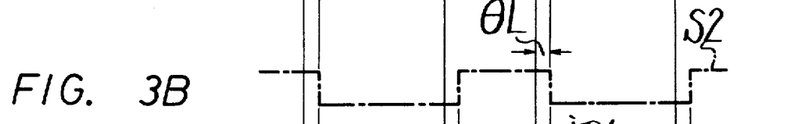
Figure 3C:
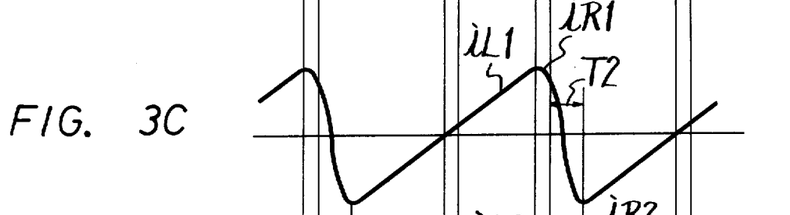
Figure 3D:
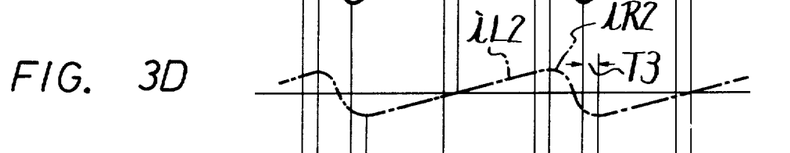
Figure 3E:
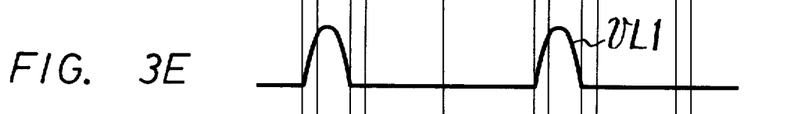
Figure 3F:
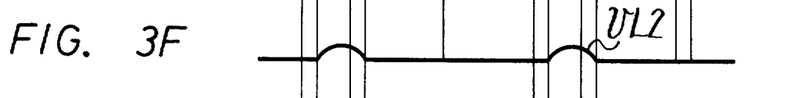
Figure 3G:
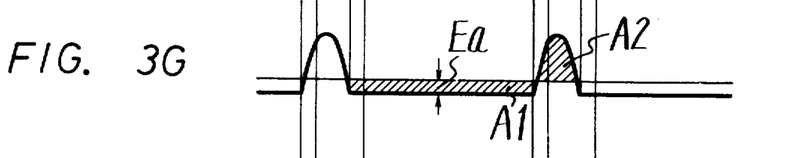
Figure 3H:
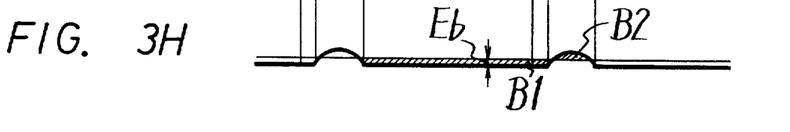
Figure 4A:
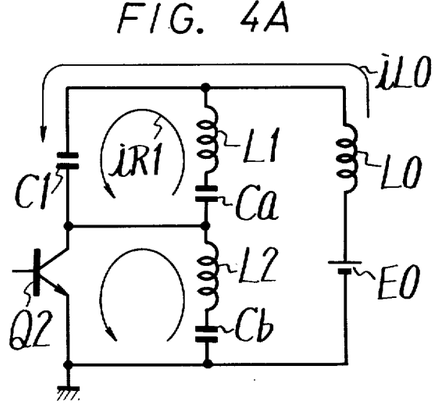
FIGS. 4A, 4B, 4C, 4D and 4E are equivalent circuits of the circuit shown in FIG. 1 at different operating times.
Figure 4B:
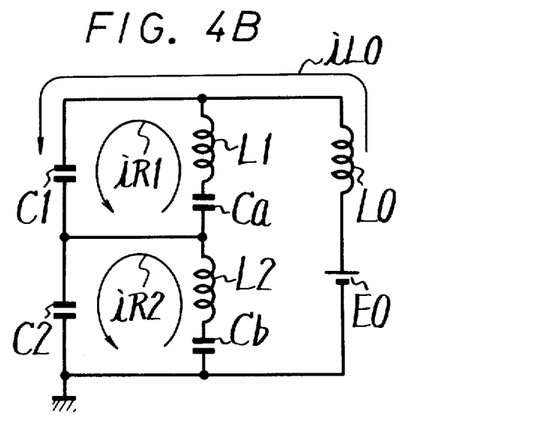
Figure 4C:
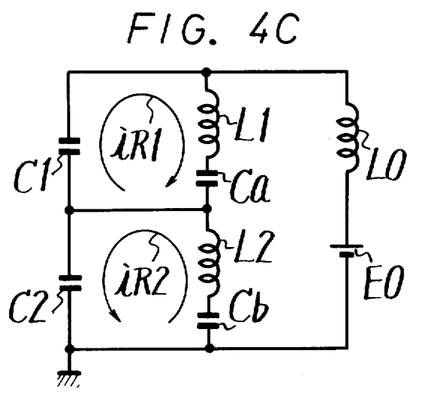
Figure 4D:
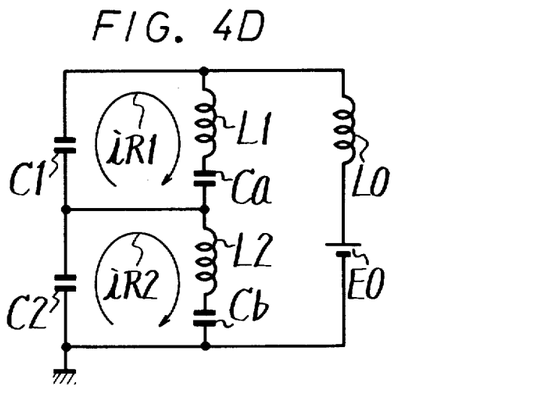
Figure 4E:
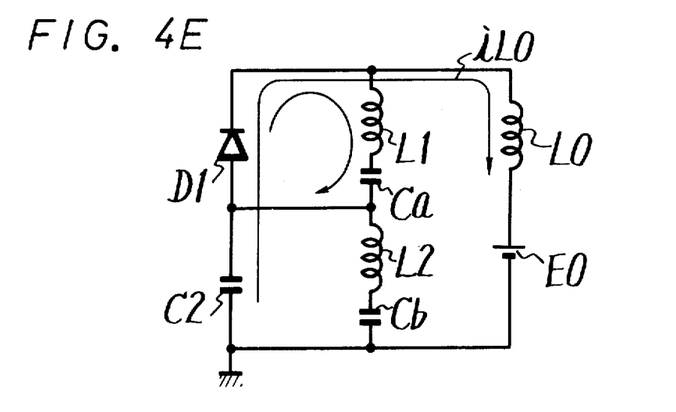

The operation of the circuit shown as FIG. 1 when the phase of the switching signal S2 is delayed relative to that of the switching signal S1 by θL will be explained with reference to FIG. 3 and FIG. 4. The waveforms of the switching signals S1 and S2 of this case are shown in FIGS. 3A and 3B, respectively. During that portion of the trace period after the damper diode D2 is made conductive, either the transistor Q1 and the damper diode D1 in the first switching circuit or either the transistor Q2 or the damper diode D2 in the second switching circuit are conductive, so that the series circuit comprising the coil L0 and the power supply E0 is short-circuited to ground. As a result, no current flows from the coil L0 to the first and second resonant circuits 15 and 25 or from the resonant circuits to the coil L0. During the latter half of the trace period when the transistors Q1 and Q2 are conductive, energy is stored in the coils L1, L2 and L0 by the increasing currents flowing through the transistors Q1 and Q2. And when the transistor Q1 is made nonconductive and the resonant current iR1 begins to flow through the coil L1, the transistor Q2 is still conductive as seen from the relation between two switching signals S1 and S2 shown in FIGS. 3A and 3B. The equivalent circuit of FIG. 1 at this timing can be rewritten as shown in FIG. 4A. In this FIG. 4A, the energy stored in the coil L1 when the transistor Q1 is conductive is transferred to the resonant capacitor C1 in the form of the resonant current iR1 because the transistor Q1 is suddenly made nonconductive. Also the energy stored in the coil L0 is transferred to the resonant capacitor C1 in the form of the current iL0. As explained above with reference to FIG. 2, if the phases of the switching signals S1 and S2 are same, the transistors Q1 and Q2 are made nonconductive at the same time, so the energy stored in the coil L0 is transferred to the resonant capacitors C1 and C2 equally. But in the case described in FIGS. 3 and 4, the transistor Q2 is made nonconductive later than the transistor Q1 by a time period T1, as shown in FIGS. 3A and 3B, and thus during this time period T1, the energy in the coil L0 is transferred only to the capacitor C1. As a result, the voltage across the capacitor C1, which is caused by the current flowing from coils L0 and L1, reaches a value higher than that reached when the phases of the switching signals S1 and S2 are same by an amount proportional to the transferred energy from the coil L0 during the time period T1. After the transistor Q2 is made nonconductive, the energy or current from the coil L0 is transferred to both of the capacitors C1 and C2 at an equal rate. The equivalent circuit of FIG. 1 at this time is shown in FIG. 4B. When the voltage across the capacitor C1 reaches the peak voltage, the resonant current iR1 changes its direction and the current begins to flow from the capacitor C1 to the coil L1, and the energy stored in the capacitor C1 is transferred back to the coil L1. The equivalent circuit of this case is shown as FIG. 4C. As seen from the FIG. 3G, the voltage Ea across the charging capacitor Ca is a function of the integrated value of the pulse voltage appearing across the capacitor C1. Because capacitor $C_a$ has a much greater capacitance than capacitor $C_1$, the voltage Ea has a relatively constant level over the period of the switching signals S1 and S2. The voltage Ea tends toward an equilibrium value in which the area A1, in which Ea is greater than the voltage across capacitor C1, and the area A2, in which Ea is less than the voltage across capacitor C1, are, as shown in FIG. 3G. Therefore, this voltage Ea across the charging capacitor Ca becomes higher than it was when the phases of the switching signals S1 and S2 were the same, that is E0/2, by an amount E related to the increased voltage of the voltage pulse across the capacitor C1. The total charging voltage across the capacitors Ca and Cb is determined by the power supply E0, and as the voltage across the charging capacitor Ca increases by $\Delta E0$ as explained above, the voltage across the charging capacitor Cb decreases by the same amount $\Delta E0$, so that the voltage Eb equals $E0/2 - \Delta E0$. When the voltage across the capacitor C2 reaches its peak voltage, which in the case discussed in FIGS. 3 and 4 is lower than across the peak voltage across the capacitor C1, the resonant current iR2 also changes its direction. The equivalent circuit at this time is shown in FIG. 4D. After the energy stored in the capacitor C1 is all transferred to the coil L1, the voltage across the capacitor C1 is changed in its polarity. As soon as the voltage across the capacitor C1 is changed in its polarity, the damper diode D1 becomes conductive, and the resonant current iR stops flowing. The equivalent circuit at this time is shown in FIG. 4E.

As explained above, when the circuit of FIG. 1 is driven by the switching signals S1 and S2, the phase difference of which is $\theta L$ as shown in FIGS. 3A and 3B, the voltages Ea and Eb across the charging capacitors Ca and Cb are expressed as follows:

$$Ea = \tfrac{1}{2} E0 + \Delta E0$$

$$Eb = \tfrac{1}{2} E0 - \Delta E0$$

As seen from above, these voltages are unequal, and as the voltages across the charging capacitors Ca and Cb can be considered as the imaginary power supply sources for the first and second resonant circuits 15 and 25. Accordingly, the currents iL1 and iL2 flowing through the coils L1 and L2 as shown in FIGS. 3C and 3D and the pulse voltages vL1 and vL2 across the coils L1 and L2 as shown in FIGS. 3E and 3F are also unequal and their relative magnitudes correspond to the magnitudes of the voltages Ea and Eb.

As the phase difference $\theta L$ between two switching signals S1 and S2 gets larger, the voltage difference $2\Delta E0$ between voltages Ea and Eb across the charging capacitors Ca and Cb, respectively becomes large because the time period T1 in FIGS. 3A and 3B, during which only the capacitor C1 is charged by the energy stored in the coil L0, becomes longer. The maximum voltage difference $\Delta E$ is clearly $E0/2$.

When the phases of the switching signals S1 and S2 are shifted by $\theta L$ in the direction opposite to that described above, the second transistor Q2 becomes nonconductive more rapidly than the first transistor Q1. Therefore, during the period corresponding to the period T1 a current path through the first transistor Q1 and the second capacitor C2 is formed so that the second capacitor C2 is charged by an additional amount. As a result, the charging voltages Ea and Eb of the capacitors Ca and Cb, respectively, are expressed by the following equation (4).

$$\left. \begin{array}{l} Ea = \tfrac{1}{2} EO - \Delta EO \\ Eb = \tfrac{1}{2} EO + \Delta EO \end{array} \right\} \quad (4)$$

where $$\Delta E0 \leq \tfrac{1}{2} E0.$$

Figure 5A:
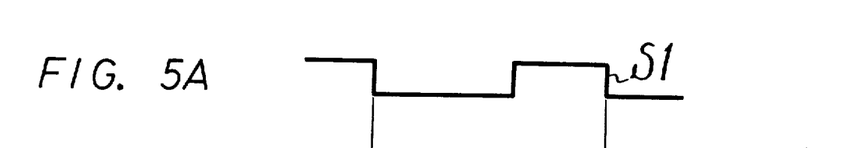
Figure 5B:
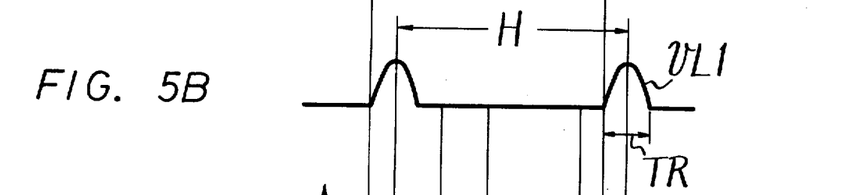
Figure 5C:
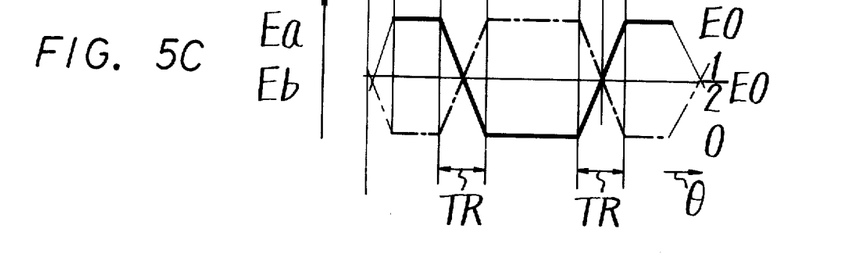

The relation between the phase $\theta$ of the switching signals and charging voltages Ea and Eb is shown in FIG. 5. As can be seen from FIG. 5, if the phase angle $\theta$ is varied about the point at which the phase of switching signal S1 equals that of switching signal S2 then the values of Ea and Eb will each vary about the voltage $\tfrac{1}{2}$ E0. However, the phase angle $\theta$ can be varied about other points to cause Ea and Eb to each vary about voltages other than ½ E0.

According to the embodiment of the present invention described above, a current can be regulated without the large power loss often found in the transistors of prior art current regulation devices. Transistors Q1 and Q2 dissipate relatively little power because they are operated in an of-off mode. When they are off they dissipate little power because virtually no current flows through them, and when they are on they dissipate little power because their impedance is nearly zero. This is contrasted with many prior art current regulation devices which use the variable impedance of transistors to variably decrease current flow, resulting in a large power dissipation in those transistors. Also according to the embodiment of the invention described above, even though current flow is regulated by the rectangular switching signals S1 and S2, the output is not a rectangular waveform current or voltage, owing to the operation of the resonant circuits 15 and 25, and hence no undesired radiation is produced and undesirable influence upon other circuits is avoided.

Figure 6:
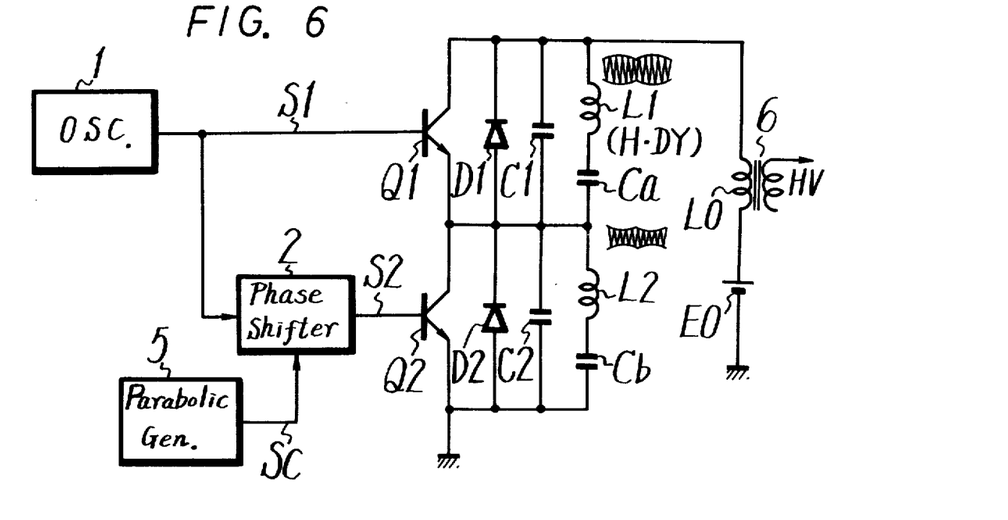
FIGS. 6 to 9 are connection diagrams showing other embodiments of the invention.

FIG. 6 is a connection diagram showing a practical embodiment of the present invention. In this embodiment the invention is applied to a left and right pincushion correcting circuit. The transistor Q1 serves as a horizontal output transistor and a horizontal deflection coil H·DY of a television receiver is used as the first coil L1. In FIG. 6, reference numeral 5 designates a generator for producing a parabolic signal Sc. If this signal Sc is used to control the phase control circuit 2 so as to produce a signal S2 whose phase shift relative to signal S1 varies parabolically, the charging voltage Ea is also modulated parabolically. Thus, the horizontal deflection current flowing through the horizontal deflection coil H·DY is modulated parabolically and hence the pin-cushion distortion is corrected. In FIG. 6, reference numeral 6 designates a fly-back transformer and its primary winding is used as the coil L0.

According to the embodiment of FIG. 6, even if the current flowing through the horizontal deflection coil H·DY is modulated parabolically, the voltage applied across the primary winding L0 of the transformer 6 remains unmodulated and hence constant. Thus, the output obtained across the secondary winding of the transformer 6 can be utilized as a high voltage output HV without undesirable side effects from the pin-cushion distortion correction.

Figure 7:
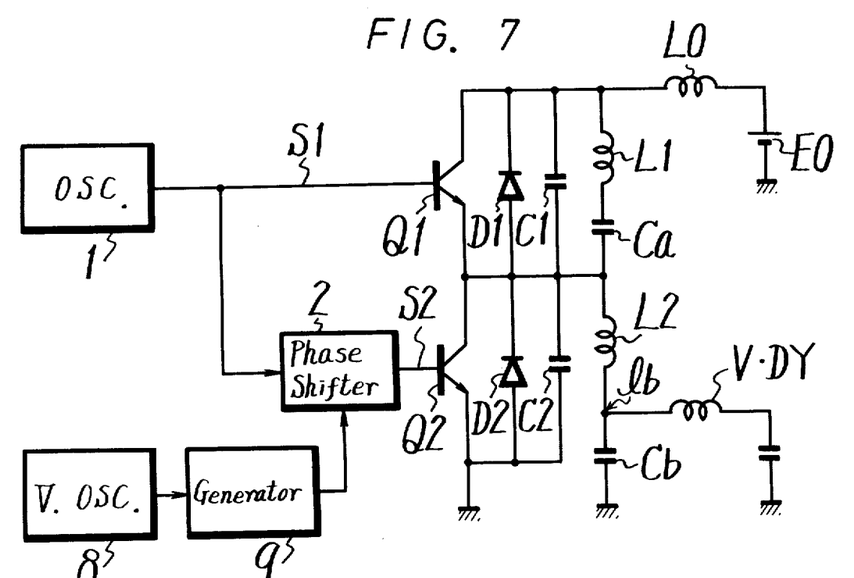

FIG. 7 is a connection diagram showing another embodiment of the invention in which the invention is applied to a vertical deflection coil. In this example, a vertical deflection coil V·DY is connected to a connection point lb between the second coil L2 and the second capacitor Cb. In FIG. 7, reference numeral 8 designates a vertical oscillator whose output is applied to a sawtooth wave signal generator 9, causing the output of that generator to have a vertical period. The output from the generator 9 is applied to the phase control circuit 2 to cause the magnitude of the phase shift between switching signals S1 and S2 to vary in a sawtooth manner. Thus, the charging voltage Eb of the capacitor Cb is modulated in a sawtooth waveform so that a desired vertical deflection current flows through the vertical deflection coil V·DY.

In the embodiment of FIG. 7, if a speaker were connected to the connection point lb instead of the vertical deflection coil V·DY and if an audio signal were supplied to phase control circuit 2 to control the phase shift between signals S1 and S2, this circuit could be used as an audio output circuit.

Figure 8:
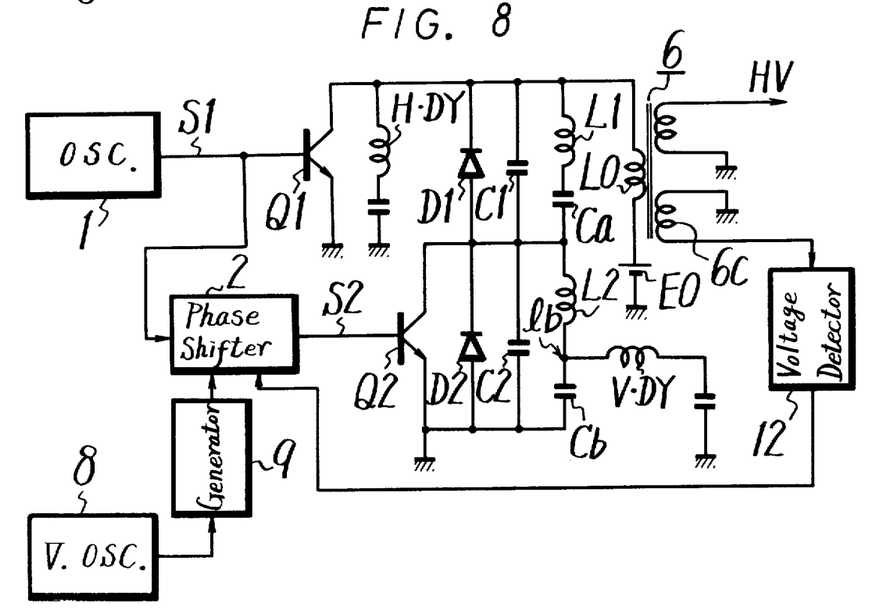

FIG. 8 is a connection diagram showing a further embodiment of the invention in which the invention is applied to horizontal and vertical deflection circuit. In this case, the horizontal deflection coil H·DY is provided separately from the first coil L1 and a tertiary coil 6c of the transformer 6 is provided with a voltage detecting circuit 12 to detect the fluctuation of the high output voltage HV. This detected output is applied to the phase control circuit 2 to amplitude-modulate the sawtooth waveform signal and hence to adjust the vertical size of a picture screen.

Figure 9:
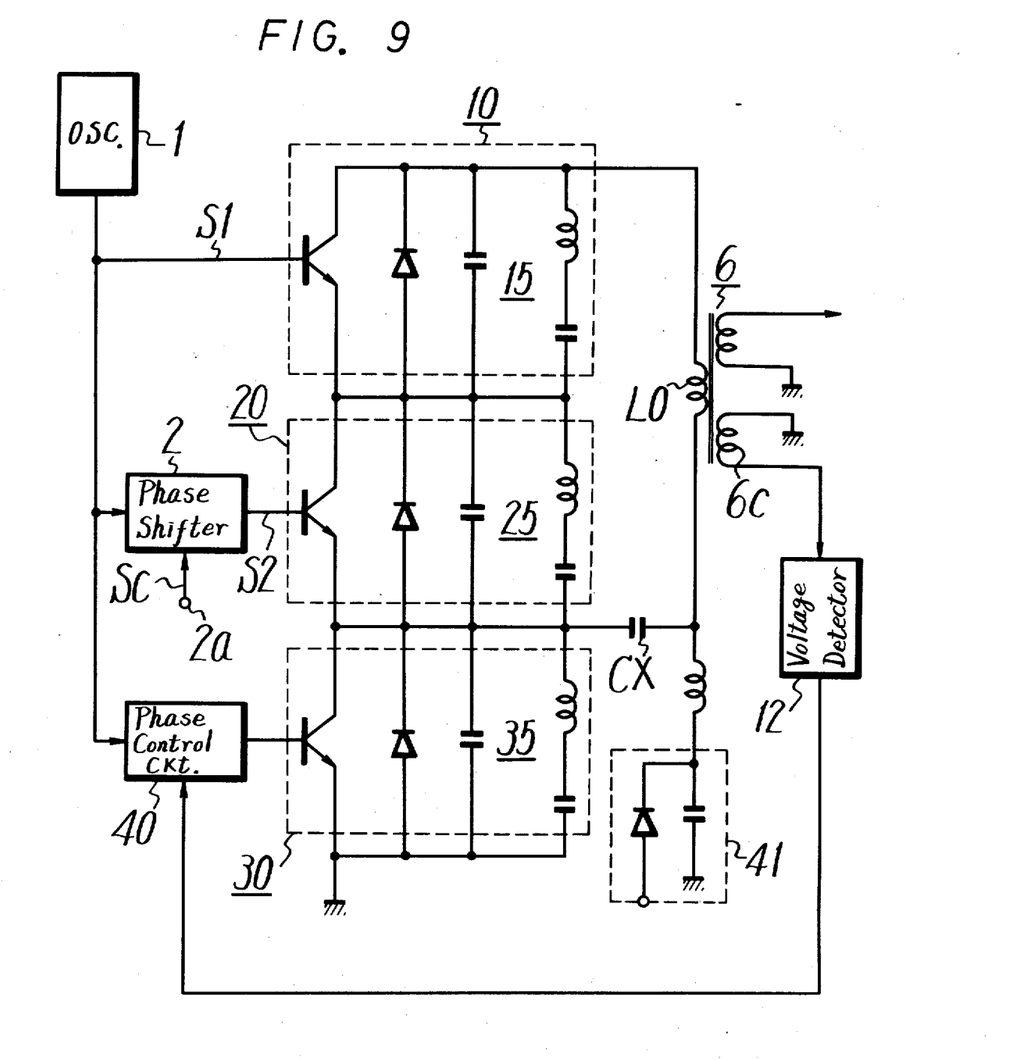

FIG. 9 is a connection diagram showing a further embodiment of the invention in which three converters 10, 20 and 30 are provided. In this case, the third converter 30 having a resonant circuit 35 is used to stabilize the voltage. That is, the detected output from the voltage detecting circuit 12 is used to control a phase control circuit 40 so as to regulate the terminal voltage Ex across a capacitor Cx and thus stabilize the high output voltage VH. In FIG. 9, reference numeral 41 designates a smoothing or rectifying circuit which is connected to a voltage source and which serves as the power supply.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

We claim as our invention:

1. A current control circuit comprising:
    first and second switching means;
    a first resonant circuit connected in parallel with said first switching means and including a first coil and a first capacitor;
    a second resonant circuit connected in parallel with said second switching means and including a second coil and a second capacitor;
    a first charging capacitor connected in series with said first coil;
    a second charging capacitor connected in series with said second coil;
    means for connecting said first and second resonant circuits in series with each other with respect to a power supply;
    means for applying first and second switching signals of the same frequency to said first and second switching means, respectively; and
    means for varying the phase relation of said first and second switching signals, so as to control the voltages across the first and second charging capacitors, and, accordingly, to control the current flowing through said first and second coils.

2. A current control means according to claim 1, wherein each of said first and second switching circuits includes a switching transistor and a damper diode connected in parallel with each other, and said first and second switching signals are applied to the switching transistors of said first and second switching circuits, respectively.

3. A current control circuit according to claim 2, wherein said means for applying the first and second switching signals includes an oscillator for generating an output with said frequency and which is applied as said first switching signal to the transistor of said first switching means, and said means for varying the phase relation of said first and second switching signals includes phase control means for receiving said output of the oscillator and providing a phase controlled output which is applied as said second switching signal to the transistor of said second switching means.

4. A current control circuit according to claim 2, in which said transistors of said first and second switching means have respective collector-emitter paths connected in series with each other, said damper diodes of said first and second switching means are connected in series with each other, and said first and second capacitors are connected in series with each other.

5. A current control circuit according to claim 1, in which one of said coils is a horizontal deflection coil of a television receiver, said frequency of the switching signals is the horizontal frequency of a video signal, and the phase relation of said first and second switching signals is varied parabolically with a repetition rate equal to the vertical frequency of said video signal so as to correct a side pin-cushion distortion of the raster of said television receiver.

6. A current control circuit according to claim 5, further comprising a flyback transformer having a primary winding connected in series between said power supply and a combined circuit comprised of first and second resonant circuits and said first and second switching means, so that current flowing from said power supply through said combined circuit produce corresponding voltage pulses across said primary winding, a secondary winding at which stepped-up voltage pulses are induced by said voltage puls across side primary winding and rectifying means for obtaining a relatively high DC voltage from said stepped-up voltages pulses.

7. A current control circuit according to claim 1, in which the phase relation of said first and second switching signals is varied by a sawtooth wave signal with a repetition rate equal to the vertical frequency of a video signal so that the voltage across one of said first and second charging capacitors is a sawtooth wave voltage with a repetition rate equal to the vertical frequency, and further comprising means for connecting a vertical deflection coil across said one of said first and second charging capacitors.

8. A current control circuit according to claim 1, in which the phase relation of said first and second switching signals is varied by an audio signal so that the voltage across one of said first and second charging capacitors is an audio signal, and further comprising means for connecting a speaker across said one of said first and second charging capacitors.

9. A current control circuit according to claim 1, wherein said means for connecting said first and second resonant circuits in series with each other with respect to a power supply includes a coil connected in series between said resonant circuits and said power supply.

* * * * *